United States Patent [19]

Sakhuja et al.

[11] Patent Number: 4,471,235

[45] Date of Patent: Sep. 11, 1984

[54] SHORT PULSE WIDTH NOISE IMMUNITY DISCRIMINATOR CIRCUIT

[75] Inventors: Shashi Sakhuja; Ray Abrishami, both of Santa Clara, Calif.

[73] Assignee: Data General Corporation, Westboro, Mass.

[21] Appl. No.: 374,538

[22] Filed: May 3, 1982

[51] Int. Cl.³ .................... H03K 5/26; H03K 17/16
[52] U.S. Cl. .................................. 307/234; 328/112; 307/471; 307/443
[58] Field of Search ............... 328/111, 112; 307/234, 307/443, 471

[56] References Cited

U.S. PATENT DOCUMENTS

| 3,387,221 | 6/1968 | Arberman et al. | 307/234 |
| 3,886,463 | 5/1975 | Caprio | 307/234 |
| 3,906,258 | 9/1975 | Moe | 307/234 |
| 3,906,379 | 9/1975 | Tuhro | 328/112 |
| 4,086,538 | 4/1978 | Foreman | 328/112 |

Primary Examiner—John S. Heyman
Attorney, Agent, or Firm—Simon Cohen

[57] ABSTRACT

A circuit is described for discriminating relatively wide, high level signal pulses from relatively narrow and/or low level noise pulses. The input pulses are first passed through a first Schmitt trigger to eliminate low level noise pulses. The output of the first Schmitt trigger is connected to a signal input of a "D" latch and to one input of an exclusive NOR gate. The exclusive NOR gate compares the input pulses from the output of the first Schmitt trigger with an output of the latch through a second Schmitt trigger. An R-C integrating network connected between the exclusive NOR gate and the second Schmitt trigger produces a rising input signal to the second Schmitt trigger that reaches the threshold level of the Schmitt trigger only for input signal pulses that exceed a given pulse width.

7 Claims, 10 Drawing Figures

SHORT PULSE WIDTH NOISE IMMUNITY DISCRIMINATOR CIRCUIT

BACKGROUND OF THE INVENTION

Noise rejection in digital signal receivers is always a major consideration in the design of any digital system, particularly those with remote peripherals. Digital transmission signals generally consist of a series of pulses having a uniform pulse width. Noise pulses are generally of short duration and vary in level both above and below the signal pulses.

In order to eliminate the effect of low level noise pulses threshold devices such as Zener diodes or Schmitt triggers that switch on at a voltage slightly lower than the signal pulse amplitude are used in series with the input terminal of a receiver. Such devices generally have only a slight or negligible effect on the pulse width of the signal pulses and eliminate noise pulses that have an amplitude below the switching voltage of the threshold device.

Eliminating short duration high amplitude pulses is a more difficult problem. The basic approach in the prior art was to either compare the input signals with a delayed version of the input signals in an NAND gate or to use an integrating circuit to convert the input pulses to ramp-like signals that increase as a function of time and to input these ramp-like signals into a threshold device.

Both of these methods produce uneven output wave forms and have other drawbacks to be described later.

A third prior art noise elimination method uses the leading edge of the input pulses to trigger two monostable multivibrators or "one shots", one producing an output pulse of a duration slightly longer than the signal pulses and the other providing an output pulse slightly shorter in duration than the signal pulse. The output of these one shots are compared in an exclusive OR gate to produce a gating pulse for an AND gate into which the original input pulse is connected. If the input pulse is of sufficient duration to persist during the gating pulse, then it is a signal pulse and the AND gate produces a triggering signal for a third one-shot that provides an output having a pulse width calculated to be the same as that of the signal pulses. Such a noise eliminator must be designed for a single pulse width and, if provided with a noise pulse immediately preceding a signal pulse, can result in an output pulse with a leading edge corresponding to the leading edge of the noise pulse. This shift of the leading edge could, of course, be remedied if the one-shots were retriggerable, but the problem of designing each set of one-shots for a particular signal pulse width would remain.

SUMMARY OF THE INVENTION

It is an object of this invention to provide a digital signal receiver with amplitude and pulse width noise rejection.

It is a further object of this invention to provide a digital signal receiver with noise immunity that faithfully reproduces the pulse width of any signal pulse of sufficient width.

It is another object of the invention to have the capability of using the same receiving circuit for both negative-going and postive-going pulses.

A receiver circuit according to this invention includes a threshold responsive device that provides an output signal in response to the concurrence of a gating signal having a level above a given threshold level and an input pulse, and also includes a comparator device. That provides for the threshold responsive device a gating signal that increases as a function of time to a level equal to the given threshold level in response to a comparison between an output of the threshold responsive device and the input pulse.

In a preferred embodiment of the invention the comparison device is an exclusive NOR gate with a first Schmitt trigger in series with one of its input terminals. The threshold responsive device is a gated "D" latch having a second Schmitt trigger in series with the gating input. The signal to another of the input terminals is a feedback connection from an output of the latch. The second Schmitt trigger with an R-C network at its input connects the exclusive NOR gate output to the gate input of the latch. The signal input to the latch is provided by the output of the first Schmitt trigger.

The first Schmitt trigger removes low level noise pulses. By comparing the output of the latch to the input thereof in the exclusive NOR gate the receiver circuit responds identically to the leading and trailing edges of signal pulses and thereby produces symmetrical output pulses having a pulse width equal to that of the input signal pulses for either positive-going or negative-going input signal pulses.

BRIEF DESCRIPTION OF THE DRAWINGS

While the novel features of this invention are set forth with particularity in the appended claims, the invention will be better understood from the following detailed description taken in conjunction with the drawings wherein:

DETAILED DESCRIPTION OF THE PREFERRED EMBODIMENTS

Figure 1:
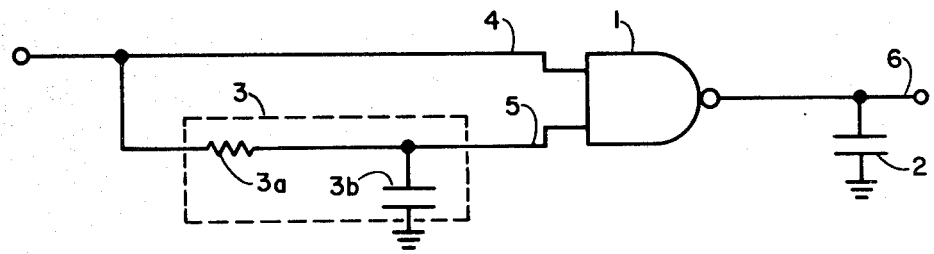
FIG. 1 is a schematic diagram of a prior art noise immunity receiver circuit.

In FIG. 1 a NAND gate 1 has a capacitor 2 attached to its output terminal 6 and an R-C network 3 connected to one of its input terminals 5. The R-C network 3 consists of resistor 3A connected in series with the input terminal 5 and a capacitor 3b shunting the input terminal 5 to ground. Input terminal 4 is connected directly to the input of this prior art receiver.

Figure 1A:
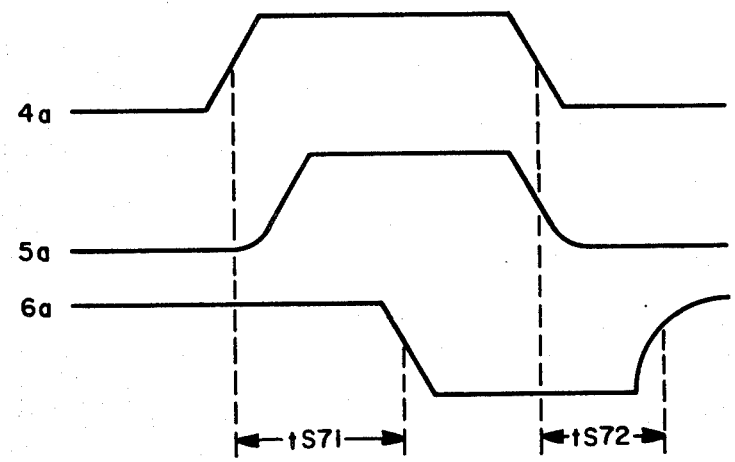
FIG. 1A is a set of timing diagrams of the signals associated with the circuit of FIG. 1.

As shown in FIG. 1A the leading edge of the input signal 4a on input terminal 4 of NAND gate 1 does not result in an output signal until capacitor 3b of R-C network 3 charges through resistor 3a to raise the input voltage on terminal 5 to the threshold voltage of gate 1. At this time the NAND gate begins to react and, after the characteristic delay of the device, provides an output. The gate 1 begins to turn off when it receives the trailing edge of the input pulse 4a on input 4. The turn-off time does not depend on R-C network 3.

This prior art apparatus has several inherent limitations. Output signal pulses shown in 6a on output terminal 6 will always be narrower than input pulses shown in 4a on input 4. That is, the delay ts71 between the leading edges of the input and output pulses is greater than the delay ts72 between the trailing edges of these pulses. This occurs because the leading edge of the output pulse is delayed by the R-C network while the trailing edge is not so delayed. Distortion in the shape of the trailing edge of the output pulse results from the increase in resistance in the discharge path of capacitor 2 when the gate 1 turns off. That is, the capacitor 2 charges rapidly through the relatively low output resistance of gate 1 during its on state and discharges through the relatively high resistance state of gate 1 during its off state. This device has difficulties filtering out noise spikes, that is, high voltage, short duration pulses. Such spikes charge capacitor 3b towards the threshold of gate 1 more rapidly than the normal voltage of signal pulses, thus enabling gate 1 in a shorter time period and permitting part of the spike to pass through the gate. Finally, the apparatus shown in FIG. 1 capacitively loads any bus that its input terminal might be connected to.

Figure 2:
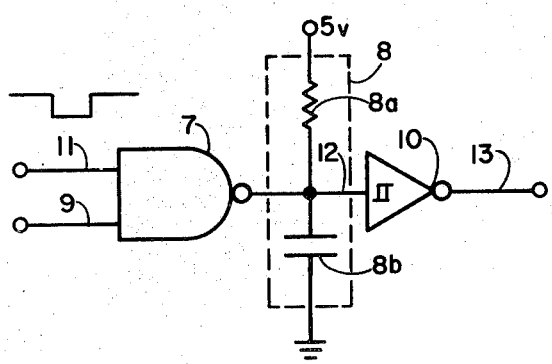
FIG. 2 is a schematic diagram of a second prior art noise immunity receiver circuit for negative-going pulses.
Figure 2A:
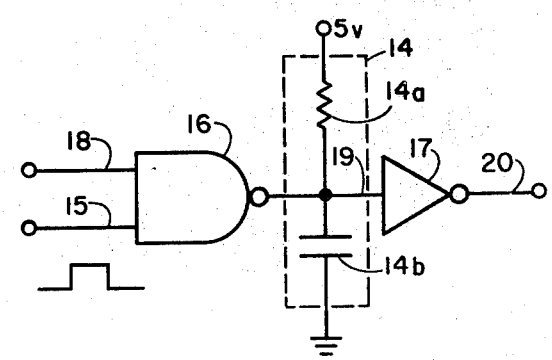
FIG. 2A is a schematic diagram of the same type of noise immunity receiver circuit as is shown in FIG. 2 for positive going signal pulses.

FIG. 2 and FIG. 2A show improved prior art noise rejection receivers for negative going and positive going signal pulses. In FIG. 2 NAND gate 7 has input terminals 9 and 11 and an output 12 connected to Schmitt trigger 10 through R-C network 8. The output 13 of Schmitt trigger 10 is shown in FIG. 2A1 at 13a.

Figure 2B:
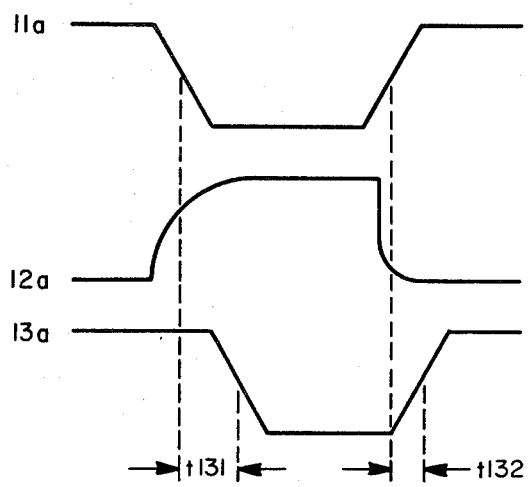
FIG. 2B is a set of timing diagrams associated with the circuit of FIG. 2.

For purposes of this explanation it will be assumed that input terminal 9 is positively biased, although without such bias it could be used to gate signals into the receiver. The normally positive level on input terminal 11 of NAND gate 7 provides a discharge path for capacitor 8b of R-C network 8 through the low output resistance of gate 7. This discharge path is removed when the leading edge of negative-going input pulse 11a of FIG. 2B causes the output of NAND gate 7 to change to a "1" level. Thus, the leading edge of the input pulse 11a changes the output state of NAND gate 7 and permits capacitor 8b to be charged by the 5 V supply through resistor 8a towards the threshold level of the Schmitt trigger in inverter 10 as shown in FIG. 2B, pulse 12a. When the threshold level is reached Schmitt trigger 10 provides a negative-going output pulse 13a. Upon receipt of the trailing edge of input pulse 11a gate 7 assumes the "0" state and rapidly discharges capacitor 8b through the low internal resistance of gate 7 in its "0" output state. When the voltage on capacitor 8B is reduced to the switch-off voltage of the Schmitt trigger 10 the output voltage 13a on terminal 13 rises to its quiescent value.

Figure 2C:
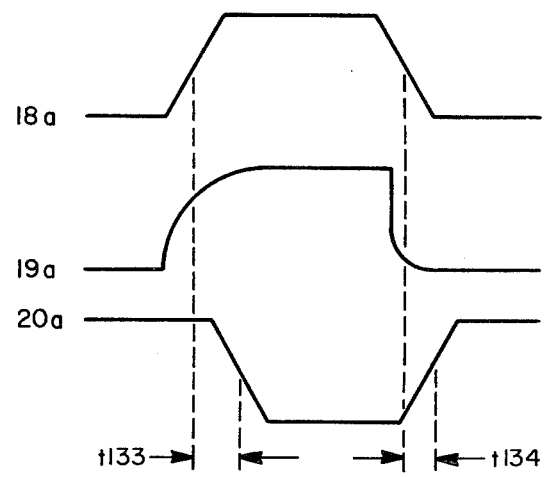
FIG. 2C is a set of timing diagrams associated with the circuit of FIG. 2A.

FIG. 2A shows an extremely similar circuit wherein an AND gate 16, with input terminals 15 and 18, has its output 19 connected to the input of a Schmitt trigger inverter 17 by R-C network 14. The operation of the receiver circuit shown in FIG. 2A is almost identical to that of FIG. 2 except that the input signals are not inverted prior to providing them to the resistor 14a and capacitor 14b of R-C network 14. Thus, as is shown in FIG. 2C the positive-going input signal pulse 18a on input terminal 18 results in a positive going pulse 19a on conductor 19 at the input of the R-C network 14 and the inverter 17. As in the device of FIG. 2 this results in a negative going output pulse 20a on output conductor 20.

While capacitive loading of the bus (not shown) that would be connected to the input 11 of this circuit is minimized, the pulse width of the output pulse 13a and 20a is shortened due to the difference in the times necessary for charging and discharging capacitors 8b and 14b. The circuit is unpractical from a financial standpoint because different circuits and different IC's are needed for positive-going and negative-going signal pulses.

Figure 3:
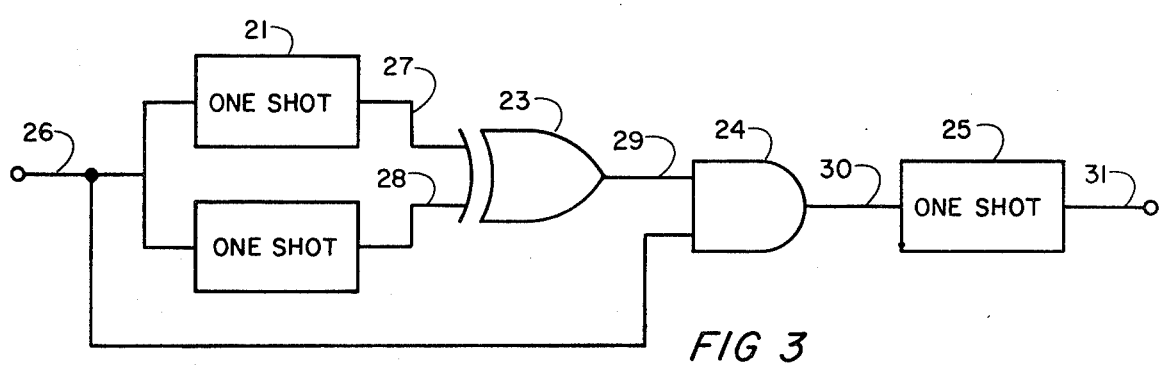
FIG. 3 is a schematic diagram of a third prior art noise immunity receiver circuit.

A somewhat different noise elimination receiver is shown in FIG. 3. In FIG. 3 a pair of monostable multivibrators, or "one-shots" is connected in common to the input 26 of the receiver. One shot 21 has an output pulse duration somewhat shorter than the length of a signal input pulse, while one shot 22 has an output pulse duration somewhat longer than the length of a signal input pulse. The outputs 27, 28 of the one shots are connected to inputs of exclusive OR gate 23. AND gate 24 is connected both to the output of gate 23 and the input 26 of the receiver. The AND gate 24 output 30 is connected to an input of one-shot 25.

Figure 3A:
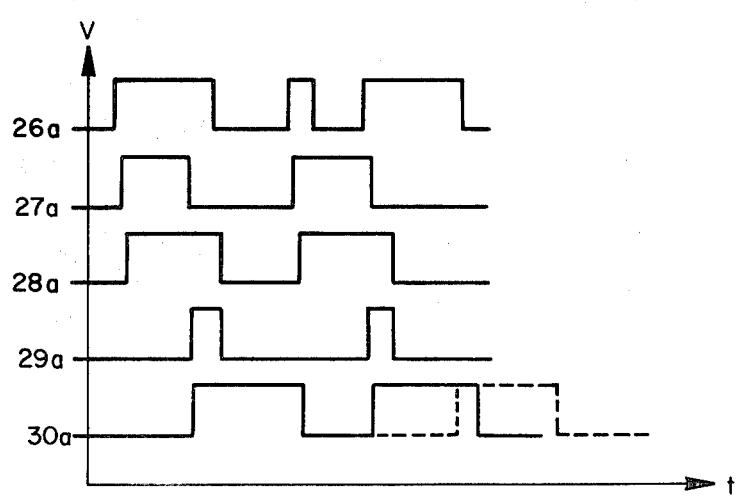
FIG. 3A is a set of timing diagrams associated with the circuit of FIG. 3.

The input signal 26a on the input 26 of the receiver consists of two signal pulses and a relatively narrow noise pulse. Each of one-shots 21 and 22 trigger on the positive going edges of these pulses unless the one-shot is in its quasistable, or active state. As shown in FIG. 3A one shot 21 produces a relatively short output pulse 27a having a pulse duration slightly shorter than the average input signal pulse length and one shot 22 produces a relatively longer output pulse 28a slightly longer than the average input signal pulse length in response to the leading edges of positively going pulses 26a on input 26. Output pulses 29a on output 29 of exclusive OR gate 23 result from a comparison between the outputs 27, 28 of the two one shots 21, 22 and have a leading edge just prior to the trailing edge of the signal input pulses 26a and a trailing edge just subsequent to the trailing edge of signal input pulses 26a. Thus, these pulses 29a from exclusive OR gate 24 form "windows" of time that ordinarily include the trailing edge of the signal input pulses 26a. If relatively narrow noise pulse triggered one-shots 21 and 22 the corresponding pulse 29a from exclusive OR gate 23 would occur well after the trailing edge of the noise pulse and would therefore not pass through AND gate 24.

The "window" pulses 29a are used to gate the trailing edges of signal pulses 26a through AND gate 24. The resulting output 30 provides a pulse corresponding to each signal input pulse 26. One-shot 25 provides output pulses 31 corresponding to pulses on output 30 but having a pulse width substantially equal to that of signal pulses 26a.

The receiver of FIG. 3 has several undesirable features. First, different one-shots would be necessary if the input signal pulse width or direction was changed. Since pulse widths can vary within any computer system, different receivers would be required for each different pulse width, thus adding to the expense of any such system. Positive-going signal input pulses would require different receivers than could be used with negative-going pulses. In addition, if, as shown in FIG.

3A, a noise pulse immediately precedes a signal pulse, the one-shots 21, 22 and the exclusive OR gate 23 will produce a "window" pulse that may occur at the leading edge or the middle of the next following signal pulse. This has the effect of shifting the leading and trailing edges of the output pulse 31a from the correct pulse position shown in the dashed lines to the position shown in solid lines. The latter problem might be corrected by using retriggerable one-shots.

Figure 4:
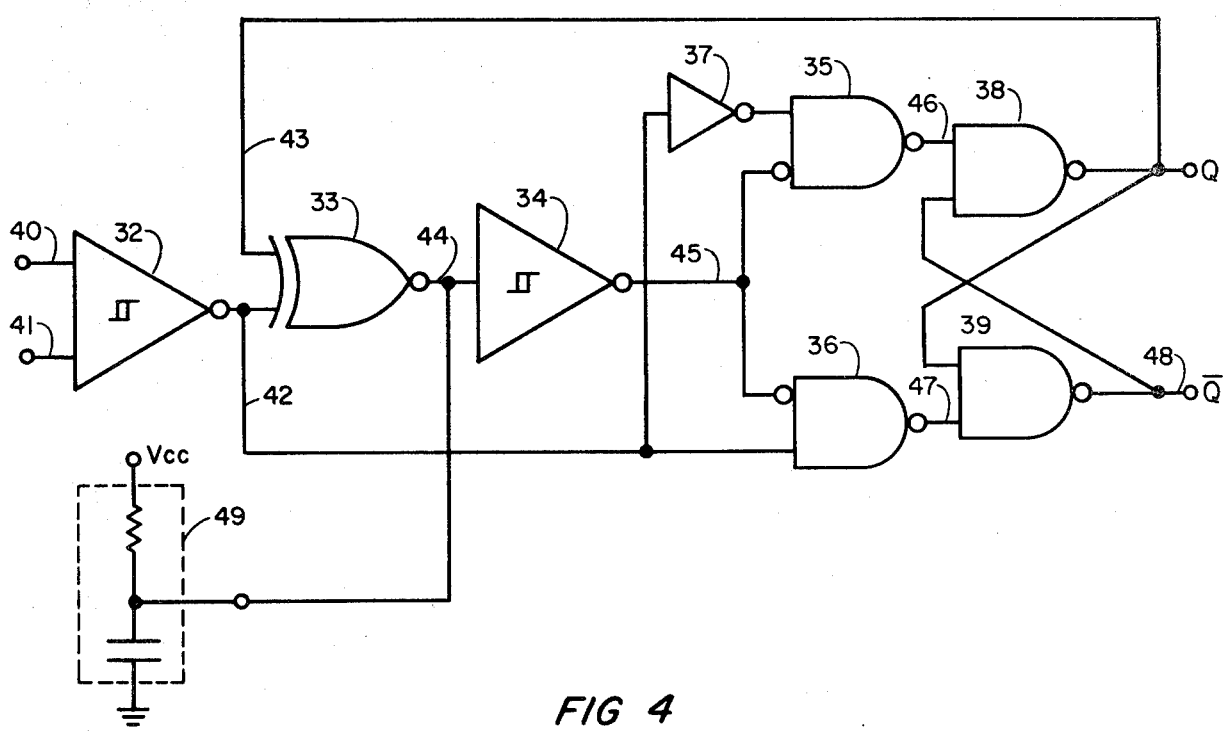
FIG. 4 is a schematic diagram of a preferred embodiment of a noise immunity circuit according to the invention.
Figure 4A:
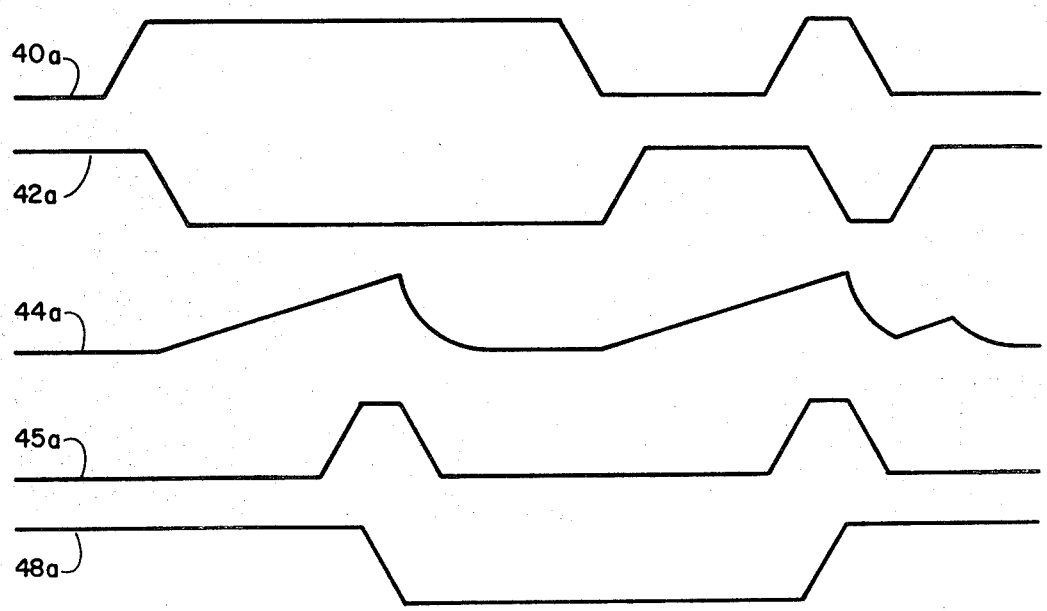
FIG. 4A is a set of timing diagrams associated with the circuit of FIG. 4.

FIG. 4 shows a preferred embodiment of our invention wherein a Schmitt trigger NAND gate 32 forms one input to exclusive NOR gate 33. An R-C network 49 is connected to an output 44 of exclusive NOR gate 33 and to an input of Schmitt trigger inverter 34. Connected in common to the output 45 of Schmitt trigger 34 are the inverting inputs of NAND gates 35, 36. The output 42 of gate 32 is connected directly to a second input of gate 36 and, through inverter 37, to a second input of gate 35. NAND gate 38 has an input connected to the output 46 of NAND gate 35. The output 47 of NAND gate 36 is connected to an input of NAND gate 39. The outputs and inputs of NAND gates 38 and 39 are cross-coupled. It should be apparent to those skilled in the art that NAND gates 35, 36, 38, 39 and inverter 37 form a typical "D" latch. The Q output of this latch is connected to the other input of exclusive OR gate 33.

It shall be assumed for this discussion that the signal on input 41 is a logical "1", since a logical "0" on this input would maintain the output of AND gate 32 at a "1" level independent of the signals on input 40 of gate 32. Thus, the signal on input 41 acts as an enabling signal for the entire receiver. Signals 40a on input 40 of gate 32 are inverted by this gate to form output signals 42a on output 42.

When inputs 40 and 41 are in logical "1" state for a long period of time the "Q" output of the "D" latch formed by NAND gates 35, 36, 38, 39 and INVERTER 37 is a logical "1", while output 48 of NAND gate 39, the "$\bar{Q}$" output of the latch is a logical "0". At this time the output signal 44a on output 44 of exclusive NOR gate 33 is a logical "0". The first negative-going leading edge of input signal 40a above the threshold of Schmitt trigger NAND gate 32 changes the output signal of exclusive NOR gate 33a to a logical "1". R-C network 49, however, does not permit the output signal 44a to immediately rise to its "1" level, but instead causes the output signal 44a to slowly increase. When the output signal 44a reaches the threshold voltage of Schmitt trigger inverter 34 the output signal 45a on output 45 of inverter 34 switches to a logical "0" state, thereby enabling NAND gates 35 and 36. The logical "1" from gate 32 causes NAND gate 36 to produce a logical "0" signal on output 47. NAND gate 39 is thereby forced into producing a logical "1" output signal. Inverted by inverter 37, the logical "1" on output 42 causes gate 35 to produce a logical "1" output 46 that, together with the logical "1" from output 48 causes gate 38 to output a logical "0". The logical "0" from gate 38 is fed back to exclusive NOR gate 33 and switches the output of that gate to a logical "0", thereby rapidly discharging the R-C network to a logical "0" level and causing inverter 34 to provide a logical "1" to NAND gates 38 and 39.

The next positive-going edge of input signal 40a is inverted by NAND gate 32, thereby applying a logical "0" to gate 33. This, together with the logical "0" on input 43, again results in a momentary rise in the ouptut of gate 33 as the R-C network 49 charges. As before, when the output of gate 33 reaches the threshold of Schmitt trigger inverter 34 the output signal 45 drops to a logical "0", again enabling gates 35 and 36. The logical "0" on output 42 is inverted by inverter 37 and causes gate 35 to provide a logical "0" output, thereby forcing gate 38 to output a logical "1" signal 48a. The logical "1" from the output of gate 38 is fed back as an input to exclusive NOR gate 33 and results in a logical "0" from gate 33 that again discharges R-C network 49 and, through inverter 34 disables gates 35 and 36.

When the leading edge of the narrow noise pulse occurs the output of exclusive NOR gate 33 begins to increase exactly as before, but prior to the time it reaches the threshold level of Schmitt trigger inverter 34, the trailing edge of the noise pulse occurs and, through gates 32 and 33, discharges the R-C network, so that the other circuit elements remain uneffected.

In the preferred embodiment Schmitt trigger inverter 34 and bistable multivibrator 35, 36, 38, 39 form a threshold responsive circuit that provides and output signal in response to the concurrence of the gating signal on output 44 having a level above the threshold level of Schmitt trigger inverter 34 and an input pulse on the output 42 of NOR gate 32. Exclusive NOR gate 33 and R-C network 49 in the preferred embodiment constitute a comparator means for providing a gating signal increasing as a function of time to a level equal to the threshold level in response to a comparison between an output of multivibrator 35, 36, 37, 38, 39 of the threshhold responsive circuit and the input pulse on the output 42 of NOR gate 32. According to another aspect of our invention the exclusive NOR gate 33 and R-C network 49 operate as a comparator means for providing an output signal in response to a comparison between the input of the receiver and an output of a switching means, formed by inverter 37 and gates 35, 36, 38 and 39. The switching means provides its output in response to concurrence between the input signal to the receiver and a gating signal 45a provided by a delay means formed by inverter 34. Obviously the R-C network 49 of the comparator means and the inverter 34 of the delay means could be replaced by a delay line, a one-shot or any other suitable means for delaying the output of gate 33.

The receiver according to our invention has many advantages. It can be used to pass both positive-going and negative-going signal pulses and block positive or negative noise pulses. The input impedance and noise immunity are higher than that of the prior art devices. By correctly choosing the Q or $\bar{Q}$ outputs of the multivibrator the device can either pass directly or invert the signal pulses. Bus loading by the device is minimal. In addition, the multivibrator is initialized to the state of the input after power is turned on without the need for any other initialization input other than the signal input. The R-C network is set to permit the output signal from exclusive NOR gate 33 to reach the threshold of the Schmitt trigger 34 only in response to pulses exceeding the normal range of noise pulses and can thus be used with any signal pulse width exceeding the maximum noise pulse width for which the receiver is set. Finally, since the delay in producing the output signal leading edge from the input signal leading edge is the same as the delay between the input and output trailing edge, the output signals will be symmetrical and have the same pulse width as the input signal pulse width without the necessity for adjusting the receiver for different signal pulse widths.

While the invention has been described with reference to an example furnished by the preferred embodiment, a device according to our invention can take other forms. As examples of such alternate firms, the Schmitt triggers could be replaced by Zener diodes; the electrical logic symbols of the drawings can also be implemented by fluid logic devices, pneumatic logic apparatus, magnetic logic or any other equivalent. Those skilled in the art will also realize the overall logic function of the device may be realized without literally following the schematic shown on FIG. 4. For example, Schmitt trigger inverter 34 could be replaced by a Zener diode.

We claim:

1. A receiver circuit for providing output pulses having pulse widths equal to the pulse widths of input pulses thereto in response to said input pulses having pulse widths greater than a predetermined pulse width, comprising threshold responsive means for providing an output signal in response to the concurrance of a gating signal having a signal level greater than a given threshold level and each of said input pulses sequentially and for terminating said output pulse in response to the concurrance of the termination of said each of said input pulse and said gating signal having said level equal to said given threshold level, and comparator means for providing for said threshold responsive means a gating signal that changes as a function of time toward a level equal to said threshold level in response to a comparison between an output of said threshold responsive means and said each of said input pulses and a comparison between the output of said threshold responsive means and the absense of said each of said input pulse to said threshold responsive means.

2. A receiver circuit as recited in claim 1, wherein said threshold responsive means comprises a gated bistable multivibrator, and a Schmitt trigger connecting said comparator means to the gating signal input of said multivibrator.

3. A receiver circuit as recited in claim 1, wherein said comparator means comprises an exclusive NOR gate having a first input connected to said input pulses and a second input connected to an inverted output of said threshold responsive means, and an integrating circuit connected between said exclusive NOR gate and said threshold responsive means.

4. Apparatus as recited in either of claims 1 or 2, wherein said comparator comprises a further Schmitt trigger in series with the input pulses and the comparator means for eliminating low level noise pulses.

5. A receiver for providing an output pulse having the same pulse width as an input pulse in response to said input pulse having a pulse width greater than a predetermined pulse width, comprising switching means for providing a change in output level in response to the concurrence of a gating signal and the leading edge of said input pulse and providing an opposite change in output level in response to a concurrence of said gating signal and the trailing edge of said input pulse, comparator means for providing an output signal in response to a comparison between the level of said input pulse and the level of the output from said switching means, and delay means responsive to the output of said comparator means for providing said gating signal to said switching means at a time delayed from the output of said means by a period larger than said predetermined pulse width.

6. A receiver as recited in claim 5, wherein the output of said comparator means is a signal that changes in magnitude with respect to time, and where said delay means comprises a threshold responsive means for providing said gating signal in response to an input signal magnitude within a predetemined range of magnitudes.

7. A receiver recited in either of claims 5 or 6 wherein said comparator means comprises an exclsuive NOR gate.

* * * * *